United States Patent
Yang et al.

(10) Patent No.: US 10,235,554 B2
(45) Date of Patent: Mar. 19, 2019

(54) ORGANIC LIGHT-EMITTING DIODE DISPLAY SUBSTRATE, DISPLAY PANEL AND SEMICONDUCTOR DEVICE CONTAINING THE SAME, AND RELATED OPERATING METHOD

(71) Applicants: BOE TECHNOLOGY GROUP CO., LTD, Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Panhua Wang, Beijing (CN); Hailin Xue, Beijing (CN); Xiaochuan Chen, Beijing (CN); Haisheng Wang, Beijing (CN); Weijie Zhao, Beijing (CN); Yingming Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 31 days.

(21) Appl. No.: 15/500,563

(22) PCT Filed: May 20, 2016

(86) PCT No.: PCT/CN2016/082889
§ 371 (c)(1),
(2) Date: Jan. 31, 2017

(87) PCT Pub. No.: WO2017/024849
PCT Pub. Date: Feb. 16, 2017

(65) Prior Publication Data
US 2017/0220839 A1      Aug. 3, 2017

(30) Foreign Application Priority Data

Aug. 12, 2015   (CN) .......................... 2015 1 0493437

(51) Int. Cl.
*G06K 9/28*      (2006.01)
*G06K 9/00*      (2006.01)
(Continued)

(52) U.S. Cl.
CPC ......... *G06K 9/0004* (2013.01); *G09G 3/3208* (2013.01); *H01L 27/3234* (2013.01);
(Continued)

(58) Field of Classification Search
CPC .................................................... G06K 9/0004
See application file for complete search history.

(56) References Cited

U.S. PATENT DOCUMENTS

2003/0067448 A1   4/2003  Park
2010/0059296 A9 *  3/2010 Abileah .............. G02F 1/13338
                                                      178/18.09
(Continued)

FOREIGN PATENT DOCUMENTS

CN   102023764 A    4/2011
CN   102209949 A   10/2011
(Continued)

OTHER PUBLICATIONS

State Intellectual Property Office of the P.R.C (SIPO) Office Action 1 for 201510493437.8 dated Jan. 19, 2018 14 Pages.
(Continued)

*Primary Examiner* — Brian Werner
(74) *Attorney, Agent, or Firm* — Westerman, Hattori, Daniels & Adrian, LLP

(57) ABSTRACT

The present disclosure provides an organic light-emitting diode (OLED) display substrate. The OLED display sub-
(Continued)

strate includes a plurality of pixel regions for displaying images; and a plurality of image recognition regions for recognizing a pattern of a light-reflecting surface structure, each image recognition region including a photoresistor.

18 Claims, 6 Drawing Sheets

(51) Int. Cl.
      *H01L 27/32*     (2006.01)
      *G09G 3/3208*   (2016.01)

(52) U.S. Cl.
     CPC . *G09G 2300/0809* (2013.01); *G09G 2358/00* (2013.01); *G09G 2360/147* (2013.01)

(56) References Cited

U.S. PATENT DOCUMENTS

| | | | | |
|---|---|---|---|---|
| 2010/0166437 A1* | 7/2010 | Ogawa | ................... | G01J 1/44 |
| | | | | 398/192 |
| 2011/0216042 A1* | 9/2011 | Wassvik | ............... | G06F 3/0412 |
| | | | | 345/175 |
| 2012/0249454 A1 | 10/2012 | Teraguchi et al. | | |
| 2013/0221856 A1* | 8/2013 | Soto | ..................... | G06F 3/0412 |
| | | | | 315/152 |
| 2015/0213662 A1* | 7/2015 | Yamazaki | ............... | G06F 21/32 |
| | | | | 340/5.53 |
| 2017/0005219 A1* | 1/2017 | Goushcha | ........... | H01L 31/0203 |
| 2017/0199606 A1* | 7/2017 | Liu | ..................... | G06F 3/0412 |
| 2017/0242533 A1* | 8/2017 | Liu | ..................... | G06F 3/0416 |

FOREIGN PATENT DOCUMENTS

| | | |
|---|---|---|
| CN | 102738199 A | 10/2012 |
| CN | 104155785 A | 11/2014 |
| CN | 104200768 A | 12/2014 |
| CN | 105095877 A | 11/2015 |

OTHER PUBLICATIONS

Liqiang Yin et al. "Design of Intelligent Fingerprint Identification System." "Computer & Network". Jun. 25, 2008. p. 196-197.
The World Intellectual Property Organization (WIPO) International Search Report for PCT/CN2016/082889 dated Aug. 26, 2016 p. 1-13.

* cited by examiner

ORGANIC LIGHT-EMITTING DIODE
DISPLAY SUBSTRATE, DISPLAY PANEL
AND SEMICONDUCTOR DEVICE
CONTAINING THE SAME, AND RELATED
OPERATING METHOD

CROSS-REFERENCES TO RELATED APPLICATIONS

This PCT patent application is a national phase entry under 35 U.S.C. § 371 of International Application No. PCT/CN2016/082889, filed on May 20, 2016, which claims priority of Chinese Patent Application No. 201510493437.8, filed on Aug. 12, 2015. The above enumerated patent applications are incorporated by reference herein in their entirety.

TECHNICAL FIELD

The present invention generally relates to the display technologies and, more particularly, relates to an organic light-emitting diode (OLED) display substrate, a display panel and a semiconductor device containing the OLED display substrate, and a related operating method.

BACKGROUND

OLED display devices often have advantages such as high light-emitting efficiencies and short responding times. Further, OLED display devices are flexible and actively emit light, requiring no backlight. As a result, OLED display devices have been widely used.

As technology advances, more and more applications demand OLED display devices with fingerprint recognition functions to improve security and operability of the OLED display devices.

However, existing OLED display devices often either do not have fingerprint recognition functions, or require extra external fingerprint recognition components with complex structures for fingerprint recognition functions. That is, fingerprint recognition functions are not well integrated into existing OLED display devices.

BRIEF SUMMARY

The present disclosure provides an organic light-emitting diode (OLED) display substrate and a related operating method. By using the OLED display substrate and the related operating method, fingerprint recognition functions are well integrated with display functions in OLED display devices.

One aspect of the present disclosure provides an organic light-emitting diode (OLED) display substrate. The OLED display substrate includes a plurality of pixel regions for displaying images; and a plurality of image recognition regions for recognizing a pattern of a light-reflecting surface structure, each image recognition region including at least one photoresistor.

Optionally, the OLED display substrate further includes a plurality of detection terminals. A photoresistor is connected to a detection terminal for detecting the pattern of the light-reflecting surface structure.

Optionally, an image recognition region is between two pixel regions.

Optionally, a plurality of image recognition regions surrounds a pixel region.

Optionally, a plurality of pixel regions is disposed between two closest image recognition regions.

Optionally, the OLED display substrate further includes one or more first voltage terminals for providing a fixed voltage. A first terminal of the photoresistor is connected to a first voltage terminal, and a second terminal of the photoresistor is connected to the detection terminal for detecting electric current flowing through the photoresistor.

Optionally, the OLED display substrate further includes one or more first voltage terminals for providing a first fixed voltage and one or more second voltage terminals for providing a second fixed voltage. The photoresistor is connected in series with a fixed-value resistor between a first voltage terminal and a second voltage terminal, the detection terminal is connected to an electrical connection path between the photoresistor and the fixed-value resistor, the detection terminal for detecting a voltage on the photoresistor.

Optionally, the OLED display substrate further includes a plurality of readout lines along a first direction and a plurality of control lines along a second direction, and a plurality of reading transistors, the first direction being different from the second direction. Each readout line is connected to a detection terminal. Photoresistors of a plurality of image recognition regions along the first direction are each connected to a readout line through a reading transistor. Each control line is connected to gate electrodes of reading transistors in the plurality of image recognition regions along the second direction.

Optionally, a readout line transmits signals generated by photoresistors to a detection terminal connected to the readout line for identifying the pattern of the light-reflecting surface structure; and a control line controls states of the reading transistors.

Optionally, the control line is connected to pixel circuits in a plurality of pixel regions aligned along the second direction for simultaneously scanning pixel regions and image recognition regions in a same row.

Optionally, each pixel region includes a plurality of pixel transistors, the pixel transistors and the reading transistors being a same type of transistors.

Optionally, the OLED display substrate further includes a base substrate and an organic light-emitting layer on the base substrate, the photoresistors being disposed between the organic light-emitting layer and the base substrate, and the OLED display substrate being a bottom emission OLED display substrate.

Optionally, the light-reflecting surface structure is a fingerprint.

Another aspect of the present disclosure provides an operating method for recognizing a pattern of a light-reflecting surface structure placed on an OLED display panel, including the disclosed OLED display substrate. The operating method includes: when the OLED display substrate is displaying images, analyzing signals generated by the photoresistor in each image recognition region to determine the pattern of the light-reflecting surface structure, the signals being generated based on light reflected by the light-reflecting surface structure.

Optionally, analyzing the signals generated by the photoresistors in the image recognition regions includes: comparing signals generated by the photoresistors in adjacent image recognition regions and determining a difference in electric current flowing through the photoresistors; and identifying image recognition regions corresponding to different parts of the pattern of the light-reflecting surface structure.

Optionally, analyzing the signals generated by the photoresistors in the image recognition regions includes: comparing signals generated by the photoresistors in adjacent image recognition regions and determining a difference in voltages across the photoresistors; and identifying image recognition regions corresponding to different parts of the pattern of the light-reflecting surface structure.

Another aspect of the present disclosure provides an OLED display panel, including a packaging substrate and one or more of the disclosed OLED display substrates, the packaging substrate being bound with the one or more OLED display substrates.

Another aspect of the present disclosure provides a semiconductor device, including one or more of the disclosed OLED displays substrates.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

One aspect of the present disclosure provides OLED display substrate. The OLED display substrate includes a plurality of pixel regions for displaying images, and a plurality of image recognition regions for recognizing a pattern of a light-reflecting surface structure. Each image recognition region includes a photoresistor. By using the OLED display substrate and the related operating method, fingerprint recognition functions are well integrated with display functions in OLED display devices.

Figure 1:
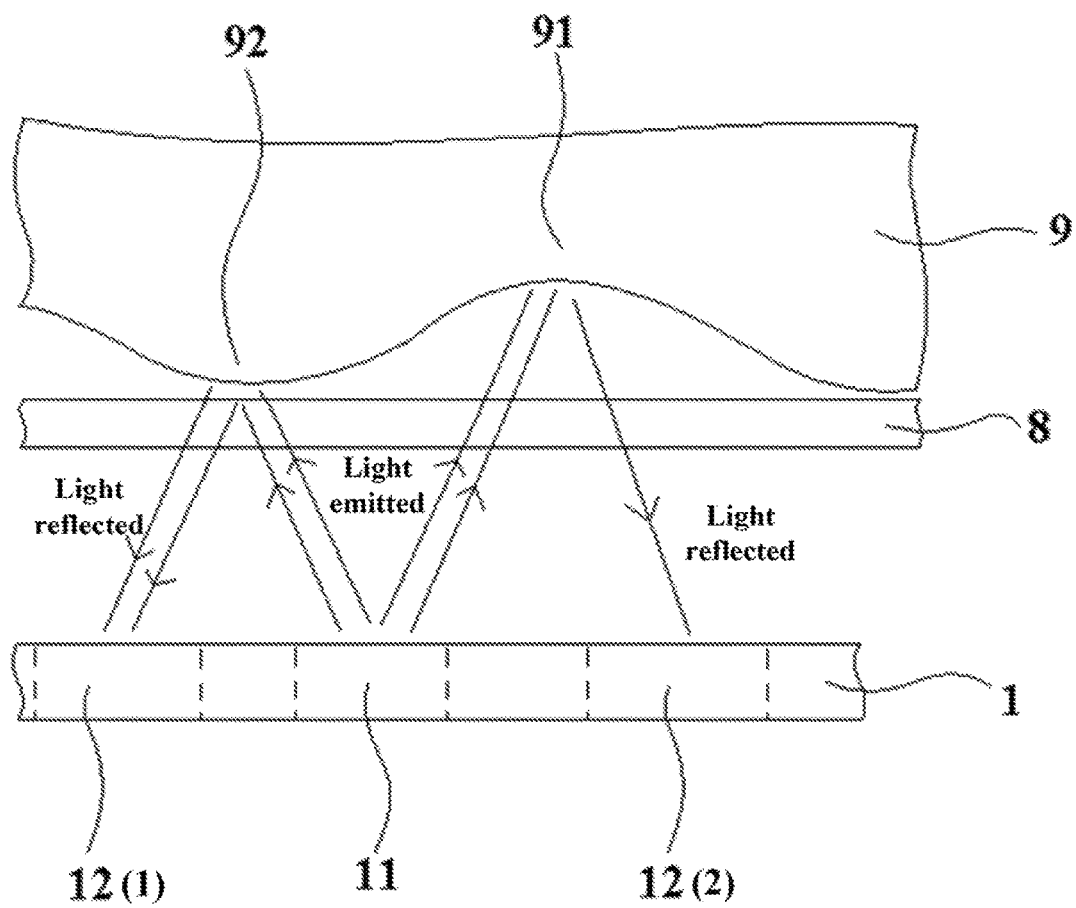
FIG. 1 illustrates the working principle of an exemplary OLED display substrate according to the embodiments of the present disclosure.
Figure 2:
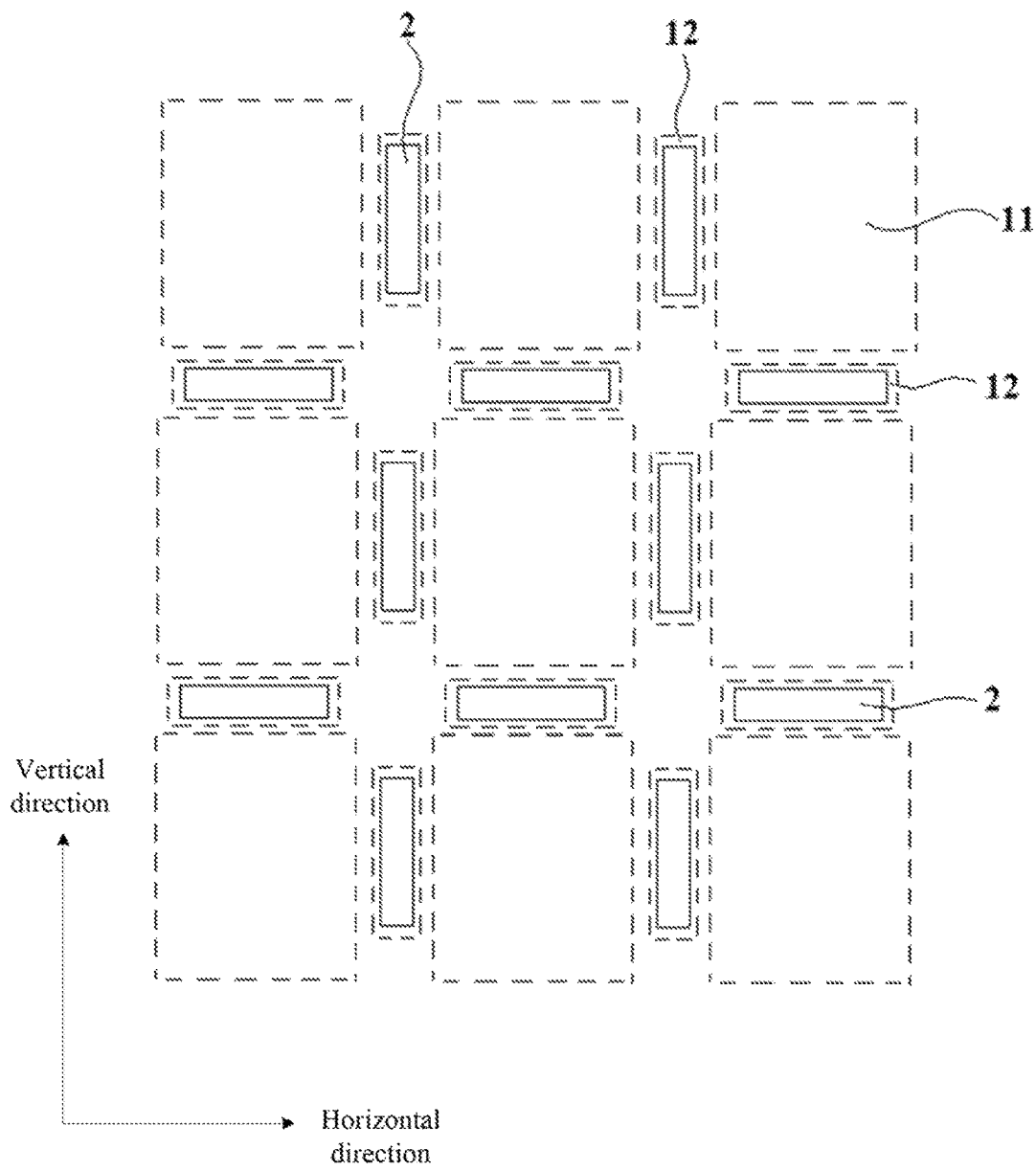
FIG. 2 illustrates a top view of a portion of an exemplary OLED display substrate according to the embodiments of the present disclosure.

As shown in FIGS. 1-9, embodiments of the present disclosure provide an OLED display substrate 1. As shown in FIGS. 1 and 2, the OLED display substrate 1 may include a plurality of pixel regions 11 for displaying images, and a plurality of image recognition regions 12 for recognizing light-reflecting surface structures, e.g., fingerprints. In the present disclosure, the embodiments are described using fingerprints as the exemplary light-reflecting surface structures. Each image recognition region 12 may include one or more photoresistors 2 connected to a detection terminal JC. For illustrative purposes, only one photoresistor 2 is used as the example to describe the embodiments.

Figure 3:
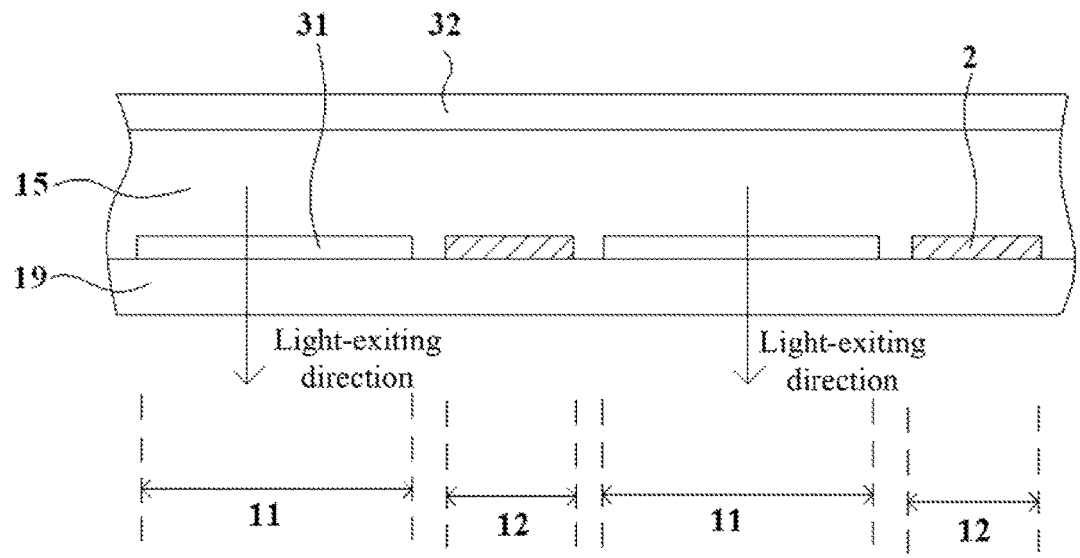
FIG. 3 illustrates a cross-sectional view of a portion of an exemplary OLED display substrate according to the embodiments of the present disclosure.
Figure 4:
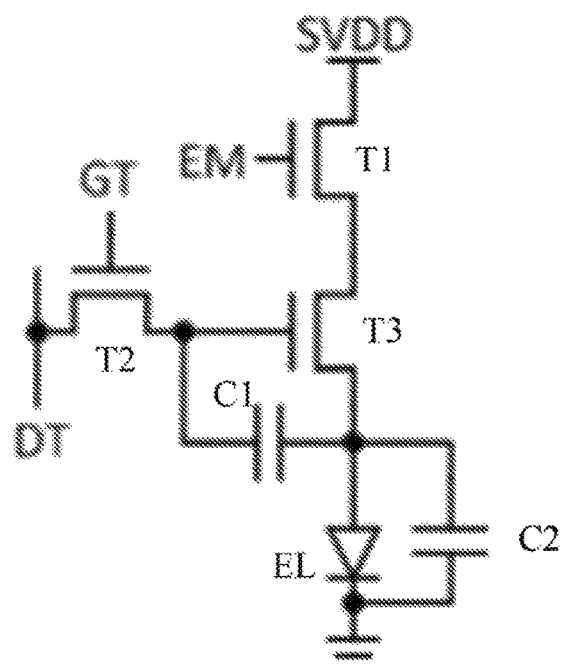
FIG. 4 illustrates an exemplary pixel circuit used in an OLED display substrate according to the embodiments of the present disclosure.

The OLED display substrate 1 provided by the present disclosure may also include display regions 11 for displaying images. A display region 11 may include one or more OLEDs and a pixel circuit for driving the OLEDs to emit light, as shown in FIG. 4. For illustrative purposes, only one OLED is used to described the disclosure. As shown in FIG. 3, an OLED may include an anode 31, a cathode 32, and a light-emitting layer 15. Each pixel region 11 may correspond to the smallest light-emitting unit in the OLED display substrate 1. The pixel regions 11 may be arranged in an array. Space between adjacent pixel regions 11 may often be used for arrangement of conductive lines, and is often not used for displaying images.

In the OLED display substrate 1 provided by the present disclosure, a plurality of image recognition regions 12 may be disposed in the space not used for displaying images, as described above. The image recognition regions 12 may be used for recognizing light-reflecting surface structures, e.g., fingerprints. Each image recognition region 12 may include one or more photoresistors 2. A photoresistor 2 may be connected to a detection terminal JC. The detection terminals JC may be arranged on the OLED display substrate 1.

When the OLED display substrate 1 is displaying images, the pixel regions 11 may emit light. Referring to FIG. 1, when a light-reflecting surface structure, e.g., a finger 9, is touching or approaching an OLED display panel containing the disclosed OLED display substrate 1, e.g., on the packaging substrate 8, light emitted by the pixel regions 11 may be reflected to at least some of the image recognition regions 12 by the light-reflecting surface structure. As shown in FIG. 1, because valleys 91 and ridges 92 may have different light-reflecting characteristics, i.e., reflecting light of different intensities at different parts of the surface, the photoresistors 2 of the image recognition regions 12 that receive the reflected light, may have varying resistance. That is, the signals received by the detection terminals JC may also vary according to the resistance variations of the photoresistors 2. Thus, by analyzing the signals generated by each image recognition region 12, image recognition regions 12 corresponding to the valleys 91 and image recognition regions 12 corresponding to the ridges 92 may be determined. The term "correspond to a certain part of a light-reflecting structure surface" may refer to receiving light reflected by the certain part of the light-reflecting structure surface. That is, for example, the detection terminals JC may identify one or more image recognition regions 12 that correspond to a valley 91 or a ridge 92 of the light-reflecting surface structure. The pattern of the light-reflecting surface structure, e.g., a fingerprint, may be determined.

It should be noted that, in the present disclosure, fingerprints are used as examples to illustrate the embodiments. However, in other various embodiments, the light-reflecting surface structure may also be a bar code, a two-dimensional code, or any other suitable objects or products capable of reflecting light with different intensities at different locations on the surface.

It should also be noted that, the object or light-reflecting surface structure, being recognized by the image recognition regions 12, may be dependent on the structure of the OLED display substrate 1. For example, the sizes of the image recognition regions 12, the distribution density of the image recognition regions 12, and the distribution locations of the image recognition regions 12 may need to be properly arranged for the object to be recognized by the recognition process. In one example, an image recognition region 12 designed for fingerprint recognition functions may be much smaller than an image recognition region 12 designed for two-dimensional code recognition functions. The distribution of the image recognition regions 12 designed for fingerprint recognition may also be much denser than the image recognition regions 12 designed for two-dimensional code recognition. The working principles of the image recognition regions 12 for various light-reflecting surface structures may be similar or the same, and are not repeated herein.

Figure 7:
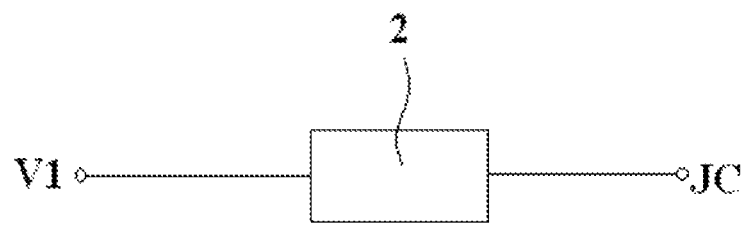
FIG. 7 illustrates an exemplary connection used in an OLED display substrate according to the embodiments of the present disclosure.

In some embodiments, as shown in FIG. 7, one terminal of a photoresistor 2 may be connected to a first voltage terminal V1, and another terminal of the photoresistor 2 may be connected to a detection terminal JC. The first voltage terminal V1 may provide a stable or fixed voltage to the photoresistor 2.

That is, referring to FIG. 7, the photoresistor 2 may be connected between a fixed-voltage terminal, i.e., the first voltage terminal V1 and a detection terminal JC. The fixed-voltage terminal may be disposed on the OLED display substrate 1. The detection terminal JC may be used for detecting electric current flowing through the connected photoresistor 2. Thus, when light with different intensities is illuminated on the photoresistor 2, the photoresistor 2 may have different resistance corresponding to the light intensities. The electric current or signal flowing through the photoresistor 2 may vary or differ according to the resistance of the photoresistor 2. Thus, by detecting the current intensity flowing through a photoresistor 2, the light intensity illuminated on the photoresistor 2 can be determined or identified.

Figure 8:
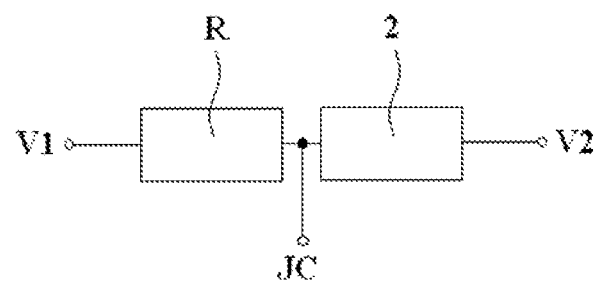
FIG. 8 illustrates another exemplary connection used in an OLED display substrate according to the embodiments of the present disclosure.

In some embodiments, as shown in FIG. 8, the photoresistor 2 may be connected in series with a resistor R with a fixed resistance between the first voltage terminal V1 and a second voltage terminal V2. The resistor R and the photoresistor 2 may be connected. A detection terminal JC may be connected to a suitable point in the electrical connection path between the first voltage terminal V1 and the second voltage terminal V2 to detect the voltage applied on the photoresistor 2.

That is, referring to FIG. 8, the photoresistor 2 may be connected in series with another resistor R between the two fixed voltage terminals, i.e., the first voltage terminal V1 and the second voltage terminal V2. The second voltage terminal may be arranged on the OLED display substrate 1. The resistor R may be a fixed-value resistor with a fixed resistance value. The detection terminal JC may be connected through a connection between the photoresistor 2 and the resistor R for detecting the voltage applied on the photoresistor 2. When light with different intensities is illuminated on the photoresistor 2, the photoresistor 2 may have different resistance corresponding to the light intensities, and the voltage applied on the photoresistor 2 may change accordingly. Because the first voltage terminal V1 and the second voltage terminal V2 provide fixed voltages, the voltage applied on the resistor R may change according to the voltage change on the photoresistor 2. Thus, by detecting the voltage or signal applied on the resistor R, the voltage applied on the photoresistor 2 can be determined by the detection terminal JC, and the light intensity illuminated on the photoresistor 2 can be determined.

It should be noted that, the methods described for generating signals, e.g., the electric current and voltage detection shown in FIGS. 7 and 8, reflecting the light intensity illuminated on the photoresistor 2 are only exemplary. Other suitable methods and structures for generating signals reflecting the light intensity illuminated on the photoresistor 2 may also be applied. It is only required that the signal generated can be detected by the detection terminal JC.

In some embodiments, an image recognition region 12 may be disposed between each two adjacent pixel regions 11.

It should be noted that, the number or distribution density of recognition regions 12 may be related to the resolution or precision of the fingerprint recognition functions. Thus, in some embodiments, as shown in FIG. 2, image recognition regions 12 may be disposed in the space between each two adjacent pixel regions 11 along the horizontal direction and along the vertical direction to obtain highest or maximum resolution. It should also be noted that, in some other embodiments, a plurality of pixel regions 11 may be disposed between two closest image recognition regions 12 along the horizontal direction or along the vertical direction. That is, a plurality of image recognition regions 12 may be disposed around a pixel region 11. The specific arrangement of the pixel regions 11 and the image recognition regions 12 should not be limited by the embodiments of the present disclosure. Because the pixel regions 11 may be arranged in an array, the horizontal direction may be referred to as the row direction of the pixel regions 11, and the vertical direction may be referred to as the column direction of the pixel regions 11, as shown in FIG. 2.

Figure 6:
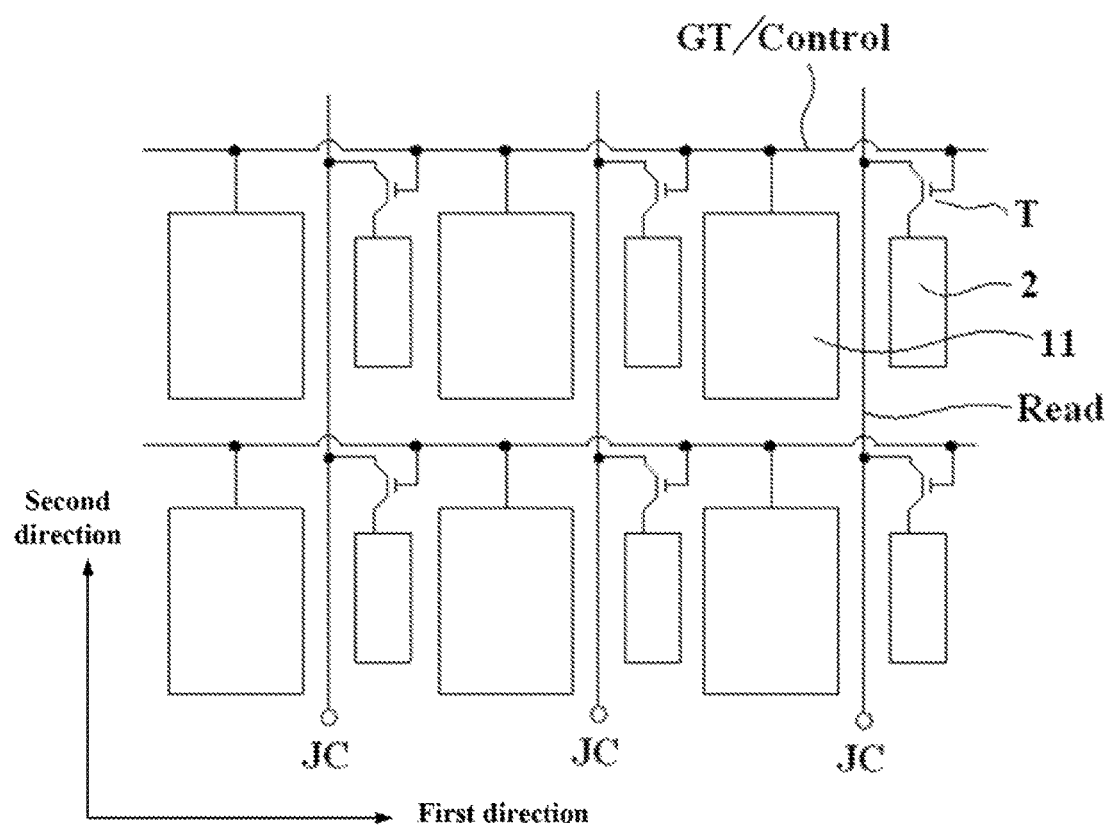
FIG. 6 illustrates an exemplary configuration of an OLED display substrate according to the embodiments of the present disclosure.

In some embodiments, as shown in FIG. 6, the OLED display substrate 1 may further include a plurality of readout lines Read arranged along the first direction or the vertical direction. Each readout line Read may be connected to a detection terminal JC. The photoresistors 2 of a plurality of image recognition regions 12 arranged along the first direction may each be connected to a readout line Read through a reading transistor T. The OLED display substrate 1 may also include a plurality of control lines Control arranged along the second direction or the horizontal direction. Each control line Control may be connected to the gate electrodes of reading transistors T of a plurality of image recognition regions 12 arranged along the second direction. The second direction/horizontal direction is different from the first direction/vertical direction. In one embodiment, the second direction is perpendicular to the first direction.

It should be noted that, an OLED display substrate 1 may include a plurality of image recognition regions 12. If the photoresistor 2 of each image recognition region 12 is connected to a detection terminal JC through a separate line, the structure or configuration of the OLED display substrate 1 may be undesirably complex. Thus, as shown in FIG. 6, the photoresistors 2 of a plurality of image recognition regions 12 aligned in one column, along the vertical direction, may be connected to a same readout line Read through the corresponding reading transistors T. The readout line Read may further be connected to a detection terminal JC. The plurality of reading transistors T of the image recognition regions 12 arranged in one row may be connected to a same control line Control through the gate electrode of each reading transistor T. Each of the reading transistors T of the image recognition regions 12 in one row may each be connected to a different readout line Read. A column of image recognition regions 12 may be aligned along the first direction and may repeat along the second direction. A row of image recognition regions 12 may be aligned along the second direction and may repeat along the first direction.

Thus, in each period, when a control line Control inputs a turn-on signal to turn on the reading transistors T, the reading transistors T connected to the control line Control may be turned on. That is, only one reading transistor T of the reading transistors T connected to each readout line Read may be turned on. Signal from the corresponding image recognition regions 12 may be transmitted into the corresponding detection terminal JC. That is, changes in the electric current in the image recognition region 12, caused by reflection of light by a light-reflecting surface structure, can be transmitted through the readout line R to the corresponding detection terminal JC. Thus, by inputting the turn-on signals to each control line Control according to a certain timing, e.g., a scanning sequence, the signals from each image recognition region 12 may be read out sequentially for fingerprint recognition functions. In other words, the image recognition regions 12 may also be controlled by a suitable scanning sequence, e.g., a scanning sequence similar to the scanning of the pixel regions 11. In one embodiment, the reading transistors T may be N-type thin-film transistors (TFTs), and the turn-on signal may be a high potential signal. In other various embodiments, the reading transistors T may also be other types of transistors, and the turn-on signals should be determined according to the types of transistors.

It should also be noted that, in the present disclosure, the embodiments are described using the first direction as the column direction, and the second direction as the row direction. In certain other embodiments, the readout lines Read may also be aligned along the row direction and may repeat along the column direction; and the control lines Control may also be aligned along the column direction and may repeat along the row direction. That is, the first direction may be the row direction and the second direction may be the column direction. In this case, the line connections and working principles of the OLED display substrate 1 may be the same as the OLED display substrate 1 described previously and are not repeated herein. In other various embodiments, the first direction may also be another direction other than the row direction, and the second direction may also be another direction other than the column direction. It is only required that the first direction is different from the second direction.

In some embodiments, a control line Control may be connected to the pixel circuits of a plurality of pixel regions 11 arranged along the second direction.

Figure 5:
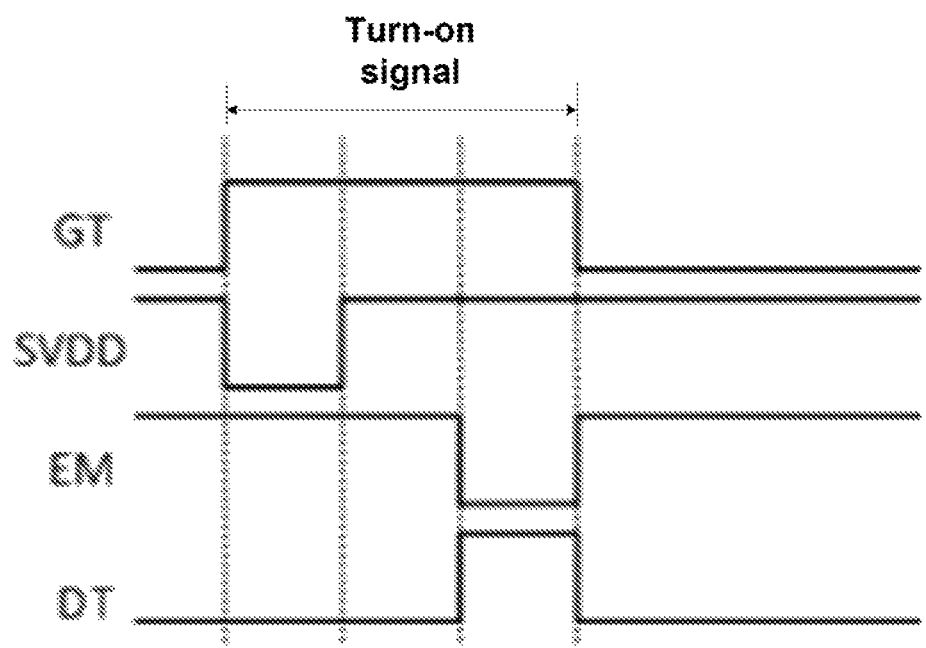
FIG. 5 illustrates an exemplary control timing diagram for the pixel circuit illustrated in FIG. 4.

To drive the OLED in each pixel region 11 to emit light, each pixel region 11 may include a pixel circuit. For example, a pixel circuit used in the pixel region 11 is shown in FIG. 4, and a timing diagram of the control signals used to drive/control the pixel circuit is shown in FIG. 5. As shown in FIG. 4, the pixel circuit may include a plurality of pixel transistors, e.g., three thin-film transistors (TFTs, i.e., T1, T2, and T3), and two capacitors (i.e., C1 and C2). The three TFTs may also be referred as the pixel transistors. T1 and T2 may be switching transistors and T3 may be a driving transistor. The first terminal of the T1 may be connected to a first reference voltage terminal SVDD, and the second terminal of T1 may be connected to the first terminal of T3. The gate electrode of T1 may be connected to a control terminal EM. The first terminal of T2 may be connected to a data line DT, and a second terminal of T2 may be connected to a first terminal of C1 and the gate electrode of T3. The second terminal of T3 may be connected to the second terminal of C1 and the anode of the OLED EL. The OLED EL may be connected in parallel to the capacitor C2 and may be grounded at the cathode. The pixel circuit with the configuration shown in FIG. 4 may reduce or eliminate drift of the threshold voltages ($V_{th}$) of the TFTs, and improve display performances. It should be noted that, other suitable pixel circuits may also be used to drive a pixel region 11 in the disclosed embodiments. The working principles of the pixel circuits are not described here in detail.

As shown in FIGS. 4 and 5, the pixel circuit may be controlled through certain conductive lines and terminals. For example, as shown in FIG. 4, the pixel circuit may be controlled by the first reference voltage terminal SVDD, the data line DT, the control terminal EM, and the gate line GT. At least some of the lines described above are arranged along the row direction and may be connected to the pixel circuits in one row. Because some of conductive lines and terminals described above may input periodic signals to the pixel circuits, at least some of the lines may be used as the control lines Control, as illustrated in FIG. 2, to control the scanning of the pixel circuits and the reading transistors T simultaneously. In other words, the conductive lines and terminals described above and the control lines Control may share the same signals. The disclosed OLED display substrate may have a simplified structure.

For example, for the pixel circuit shown in FIG. 4, the gate line GT may input a periodic signal to the pixel circuit. A gate line GT may be connected to the gate electrodes of a plurality of reading transistor T in one row. In a period, when the gate line GT inputs a turn-on signal to turn on T2, the turn-on signal may also be applied on the gate electrode of the connected reading transistors T. Thus, the voltage or current generated by the corresponding image recognition regions 12 in the same row, containing the connected reading transistors T, may be read out by the readout lines Read connected to the reading transistors T. That is, the gate line GT may also be used as the control line Control of the reading transistors T in the same row. A control line Control may be used to control the scanning of pixel regions and the image recognition regions simultaneously.

It should be noted that, FIG. 6 is for illustrative purposes and only shows the electrical connections of lines between different parts of the OLED display substrate 1. FIG. 6 does not represent the actual physical structure of the OLED display structure 1. Some structures or features are not shown in FIG. 6.

In some embodiments, the pixel transistors in the pixel circuits and the reading transistors T may be the same type of transistors. For example, the pixel transistors and the reading transistors T may be N-type transistors, and the turn-on signal may be a high-potential signal. Thus, the active regions of the reading transistors T and the active regions of the pixel transistors may be formed in a same fabrication step so that the fabrication of the OLED display substrate 1 may be simplified. In certain other embodiments, the pixel transistors and the reading transistors T may be different types of transistors, depending on the applications.

In some embodiments, as shown in FIG. 3, the OLED display substrate 1 may include a base substrate 19 and an organic light-emitting layer 15 disposed on the base substrate 19. The photoresistors 2 may be disposed between the organic light-emitting layer 15 and the base substrate 19. The anodes 31 of the OLEDs may be disposed on the base substrate 19, and the cathodes 32 of the OLEDs may be disposed on the organic light-emitting layer 15. The anodes 31 may be disposed in the pixel regions 11, and the photoresistors may be disposed in the image recognition regions 12. The OLED display substrate 1 may be a bottom emission OLED display substrate. In one embodiment, as shown in FIG. 3, one image recognition region 12 may be arranged between two adjacent pixel regions 11. For a bottom emission OLED display substrate, a finger may touch or approach the base substrate 19, and the light emitted by the organic light-emitting layer 15 may transmit through the base substrate 19 to exit the OLED display substrate. The light-existing direction is shown in FIG. 3.

That is, the disclosed OLED display substrate 1 may preferably be a bottom emission OLED display substrate, in some embodiments. The light emitted by the organic light-emitting layer 15 may be transmitted through/emitted from the base substrate 19. In this case, the photoresistors 2 may be disposed between the organic light-emitting layer 15 and the base substrate 19, so that the light reflected by the touching finger would not pass through the organic light-emitting layer 15. The detection of the light intensity is less susceptible to other external interference. The detection may have improved accuracy.

If the OLED display substrate 1 is a top emission OLED display substrate, i.e., the light emitted by the organic light-emitting layer 15 is emitted from the side of the OLED display substrate 1 facing away from the base substrate 19, the light-exiting direction would be opposite of the light-exiting direction shown in FIG. 3. In this case, a finger may touch or approach the OLED display substrate 1 on the cathode 32. The photoresistors 2 may be disposed on the side of the organic light-emitting layer 15 that faces away from the base substrate 19. Considering factors such as fabrication stability, it would be preferable to dispose the photoresistors 2 and related circuits on the base substrate 19, instead of on the organic light-emitting layer 15. Thus, preferably, the disclosed OLED display substrate 1 would be a bottom emission OLED display substrate.

Another aspect of the present disclosure provides an operating method for recognition of patterns of light-reflecting surface structures. Fingerprint recognition may be used as an example in the disclosure for illustrative purposes. The method may include, when the disclosed OLED display substrate 1 is displaying images, analyzing signals generated by the photoresistors 2 in each image recognition region 12 caused by the light reflected by light-reflecting surface structures, e.g., a finger 9 in FIG. 1, to obtain the pattern of the light-reflecting surface structure, e.g., a fingerprint.

That is, when the disclosed OLED display substrate 1 is displaying images, each pixel region 11 may emit light. When a finger 9, i.e., the light-reflecting surface structure, is approaching or touching the OLED display substrate 1, the light emitted by the pixel regions 11 in and near the touch location may be reflected back by the finger 9. The reflected light may reach the image recognition regions 12 at and near the touch location so that the photoresistors 2 in these image recognition regions 12 may generate signals, such as electric current or voltages. Because the reflective characteristics of the ridges 92 and the reflective characteristics valleys 91 are different, the light intensity illuminated on the image recognition regions 12 corresponding to a ridge 92, e.g., image recognition region 12(1) in FIG. 1, may be different from the light intensity illuminated on the image recognition regions 12 corresponding to a valley 91, e.g., image recognition region 12(2) in FIG. 1. That is, the signals generated by the image recognition regions 12 corresponding to a ridge 92, e.g., image recognition region 12(1) in FIG. 1, may be different from the signals generated by the image recognition regions 12 corresponding to a valley 91, e.g., image recognition region 12(2) in FIG. 1. Thus, by analyzing the signals generated by each image recognition region 12, the image recognition regions 12 corresponding, to the ridges 92 and the valleys 91 may be determined by the detection terminal JC. By scanning the image recognition regions 12 row by row, the differences in electric current generated by, the image recognition regions corresponding to the touching finger may be transmitted to the detection terminals JC. In this way, the pattern of the fingerprint of the finger 9 may be obtained and the fingerprint recognition process may be completed.

Because light illuminated by the outside environment often has a sufficiently higher intensity than the light intensity reflected by the light-reflecting surface structure and a considerably uniformed distribution, the signals generated by the image recognition regions 12 corresponding to the light illuminated by the outside environment and by the image recognition regions 12 corresponding to the reflected light would at least have recognizable difference in intensities. Thus, the detection terminals JC would be able to detect the pattern of the light-reflecting surface structure.

In some embodiments, a process to determine or recognize the signals generated by the photoresistors 2 in the image recognition regions 12, illuminated by the light reflected by the light-reflecting surface structure, may include comparing signals of each image recognition region 12 and determining the signals generated by photoresistors 2 that receive light reflected by the light-reflecting surface structure, e.g., the finger 9 in FIG. 1. The detection terminals JC may identify the image recognition regions 12 corresponding to the ridges 92 and the valleys 91.

That is, in some embodiments, a suitable comparison process applied on signals generated by adjacent image recognition regions 12, e.g., a difference method, may be used to determine if an image recognition region 12 corresponds to a valley 91 of the fingerprint or a ridge 92 of a fingerprint. The reasons for performing a suitable comparison process include the following. Although light reflected by the ridges 92 and the valleys 91 may have different intensities, the intensities of the reflected light may be largely dependent on the light illuminated on the linger 9. When each pixel region 11 illuminates light of a different intensity, it may be difficult to determine the fingerprint pattern based on the absolute value of signal generated by each image recognition region 12. Also, because neighboring image recognition regions 12 may be located sufficiently close to each other, light intensities generated by neighboring pixel regions 11 may be close or the same. Thus, the difference in signals generated by neighboring image recognition regions 12 may be considered to be caused only by different features or different light-reflecting characteristics on the fingerprint. Thus, it may be easier to determine the fingerprint pattern based on the differences in light intensities generated by neighboring image recognition regions 12.

It should be noted that, other suitable methods may also be used to determine fingerprint pattern. For example, the light intensity emit by each pixel region 11 may be calculated in advance before displaying images. Further, when a finger 9 is approaching or touching the disclosed OLED display substrate 1, the detection terminals JC may calculate the absolute values of the signals generated by the image recognition regions 12 corresponding to the valleys 91 and corresponding to the ridges 92 of the finger 9, respectively.

The calculated absolute values of signals may be used to recognize the fingerprint pattern.

Another aspect of the present disclosure provides a semiconductor device. The semiconductor device may include one or more of the disclosed OLED display array substrates. In one embodiment, the semiconductor device may be a display apparatus.

That is, the one or more OLED display substrates may be integrated with packaging substrates, a power supply, a shell, and other related parts to form a display apparatus, which can be ready to use.

Figure 9:
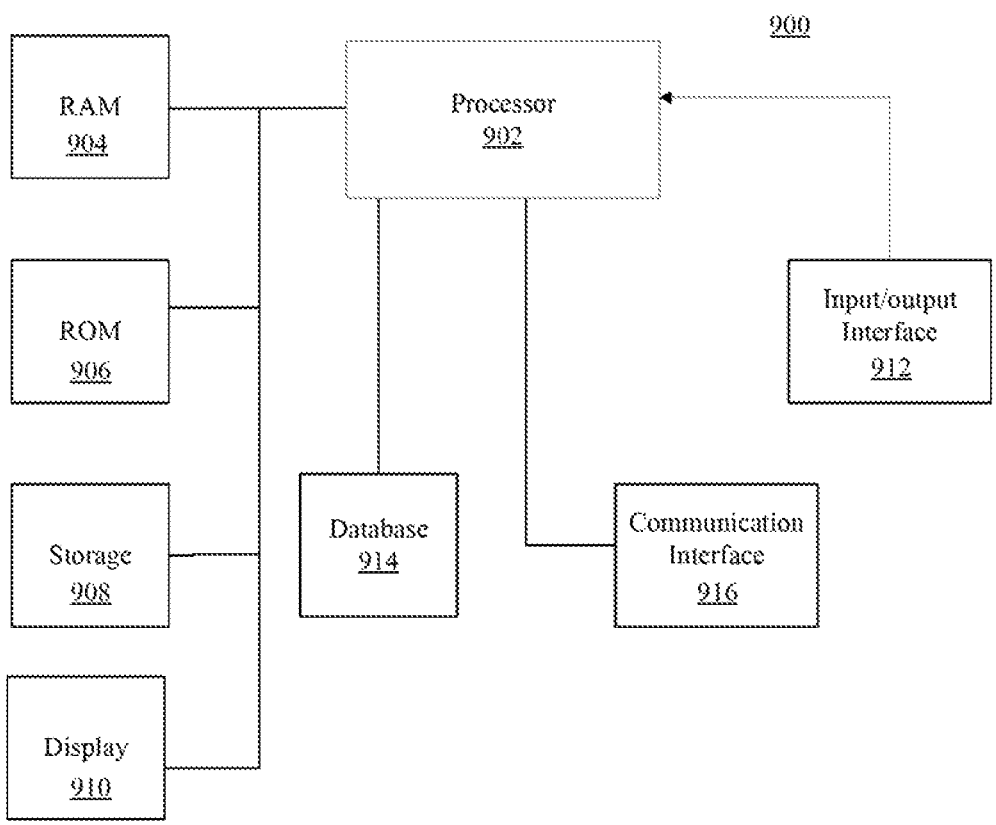
FIG. 9 illustrates the block diagram of a detection terminal used in an OLED display substrate according to the embodiments of the present disclosure.

In the display apparatus, the detection terminals JC may contain or be connected to suitable software and hardware modules for detecting and identifying fingerprint patterns. FIG. 9 illustrates a block diagram of the detection terminal JC used in the present disclosure.

The detection terminal JC may receive, process, and execute commands from the semiconductor device. The detection terminals JC may include any appropriately configured computer system. As shown in FIG. 9, detection terminals JC may include a processor 902, a random access memory (RAM) 904, a read-only memory (ROM) 906, a storage 908, a database 914; and a communication interface 916. Other components may be added and certain devices may be omitted without departing from the principles of the disclosed embodiments. In certain embodiments, the detection terminals JC may include one or more a display 910 and an input/output interface 912.

Processor 902 may include any appropriate type of general purpose microprocessor, digital signal processor or microcontroller, and application specific integrated circuit (ASIC). Processor 902 may execute sequences of computer program instructions to perform various processes associated with detection terminals JC. Computer program instructions may be loaded into RAM 904 for execution by processor 902 from read-only memory 906, or from storage 908. Storage 908 may include any appropriate type of mass storage provided to store any type of information that processor 902 may need to perform the processes. For example, storage 908 may include one or more hard disk devices, optical disk devices, flash disks, or other storage devices to provide storage space.

Display 910 may provide information to a user or users of the detection terminal JC. Display 910 may include any appropriate type of computer display device or electronic device display (e.g., CRT or LCD based devices). Input/output interface 912 may be provided for users to input information into detection terminal JC or for the users to receive information from detection terminal JC. For example, input/output interface 912 may include any appropriate input device, such as a keyboard, a mouse, an electronic tablet, voice communication devices, touch screens, or any other optical or wireless input devices. Further, input/output interface 912 may receive from and/or send to other external devices.

Further, database 914 may include any type of commercial or customized database, and may also include analysis tools for analyzing the information in the databases. Database 914 may be used for storing data for fingerprint recognition and other related processes. Communication interface 916 may provide communication connections such that detection terminals JC may be accessed remotely and/or communicate with other systems or components through computer networks or other communication networks via various communication protocols, such as transmission control protocol/internet protocol (TCP/IP), hyper text transfer protocol (HTTP), etc.

In one embodiment, a user may touch or approach the OLED display substrate and the detection terminal JC may receive signals generated by the image recognition regions. The processor 902 may receive, process, and execute the signals to obtain the fingerprint pattern based on the related information stored in the database 914, ROM 906, and storage 908. In one example, the processor 902 may apply the different method to the signals received from the image recognition regions. After the data are processed, result of the pattern recognition can be obtained. The display apparatus may respond accordingly to the result of the pattern recognition.

The display apparatus according to the embodiments of the present disclosure can be used in any product with display functions such as a television, an OLED display panel, a monitor, a laptop computer, an electronic paper, a digital photo frame, a mobile phone, a navigation device, and a tablet computer.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An organic light-emitting diode (OLED) display substrate, comprising:
   a plurality of pixel regions with each pixel region comprising a pixel circuit having a control terminal;
   a plurality of image recognition regions for detecting valleys and ridges of fingerprint comprising:
     a plurality of first image recognition regions corresponding to the detected valleys for receiving a first reflected light from the detected valleys to generate a first signal; and
     a plurality of second image recognition regions corresponding to the detected ridges for receiving a second reflected light from the detected ridges to generate a second signal different from the first signal;
   a plurality of readout lines along a first direction;
   a plurality of control lines along a second direction being different from the first direction;
   a plurality of reading transistors with each reading transistor having a control terminal, a first terminal and a second terminal;
   wherein each image recognition region of the plurality of image recognition regions includes at least one photoresistor with each photoresistor having a first terminal and a second terminal;
   each control terminal of each reading transistor of the plurality of reading transistors and each control terminal of each corresponding pixel circuit of the plurality of pixel regions are connected to the same control line; and
   each control line of the plurality of control lines is connected with a subset of the plurality of pixel regions in the second direction and a corresponding subset of the plurality of image recognition regions in the second direction, each control line is configured to control scanning of the subset of the plurality of pixel regions and the corresponding subset of the plurality of image recognition regions simultaneously, wherein each image recognition region of the plurality of image recognition regions in the second direction exists between adjacent pixel regions along the second direction, and each image recognition region in the second direction shares the same control line as pixel regions along the second direction.

2. The OLED display substrate according to claim 1, further including a plurality of detection terminals, wherein:
first terminals of the plurality of reading transistors are connected to second terminals of the at least one photoresistor;
second terminals of the plurality of reading transistors are connected to respective detection terminal of the plurality of detection terminals; and
the plurality of detection terminals are configured to detect the first signal and the second signal.

3. The OLED display substrate according to claim 1, wherein each image recognition region of the plurality of image recognition regions is between two pixel regions of plurality of pixel regions.

4. The OLED display substrate according to claim 1, wherein each pixel region of the plurality of pixel regions is surrounded by the plurality of image recognition regions.

5. The OLED display substrate according to claim 1, wherein each pixel region of the plurality of pixel regions is between two closest image recognition regions of plurality of pixel regions.

6. The OLED display substrate according to claim 2, further comprising one or more first voltage terminals for providing a fixed voltage, wherein first terminals of the at least one photoresistor are connected to the one or more first voltage terminal, wherein the plurality of the detection terminal are configured to detect electric current flowing through the photoresistor.

7. The OLED display substrate according to claim 2, further comprising one or more first voltage terminals for providing a first fixed voltage and one or more second voltage terminals for providing a second fixed voltage, wherein one of the at least one of photoresist is connected in series with a fixed-value resistor between one of the first voltage terminals and one of the second voltage terminals, one of the plurality of detection terminals is connected to an electrical connection path between the one of the at least one of photoresist and the fixed-value resistor, the detection terminal for detecting, a voltage on the one of the at least one of photoresist.

8. The OLED display substrate according to claim 2, wherein: each readout line of the plurality of readout lines is connected to a respective detection terminal of the plurality of detection terminals; each of the at least one of photoresistors along the first direction are connected to respective readout line through respective reading transistor.

9. The OLED display substrate according to claim 2, wherein: the plurality of readout line are configured to transmit signals generated by the at least one photoresistor to respective detection terminal connected to corresponding readout line for identifying the valleys and ridges of fingerprint.

10. The OLED display substrate according to claim 1, wherein each pixel region includes a plurality of pixel transistors, the pixel transistors and the reading transistors are a same type of transistors.

11. The OLED display substrate according to claim 1, further including a base substrate and an organic light-emitting layer on the base substrate, the at least one of photoresistors being disposed between the organic light-emitting layer and the base substrate, and the OLED display substrate being a bottom emission OLED display substrate.

12. An operating method for recognizing a pattern of a light-reflecting surface structure placed on an OLED display panel, comprising the OLED display substrate of claim 1, including: controlling scanning of the row of the plurality of pixel regions and the row of the plurality of recognition regions simultaneously by the same gate line; when the OLED display substrate is displaying images, analyzing the first signal and the second signal generated by the photoresistor in each image recognition region to determine valleys and ridges of the fingerprint.

13. The operating method according to claim 12, wherein analyzing the first signal and the second signal generated by the photoresistor in each image recognition region to determine valleys and ridges of the fingerprint includes: comparing signals generated by the photoresistors in adjacent image recognition regions and determining a difference in electric current flowing through the photoresistors; and identifying image recognition regions corresponding to valleys and ridges.

14. The operating method according to claim 12, wherein analyzing the first signal and the second signal generated by the photoresistor in each image recognition region to determine valleys and ridges of the fingerprint includes: comparing signals generated by the photoresistors in adjacent image recognition regions and determining a difference in voltages across the photoresistors; and identifying image recognition regions corresponding to valleys and ridges.

15. An OLED display panel, including a packaging substrate and one or more of the OLED display substrates according to claim 1, the packaging substrate being bound with the one or more OLED display substrates.

16. A semiconductor device, including one or more of the OLED display substrates according to claim 1.

17. The OLED display substrate according to claim 1, wherein the first terminals of the plurality of reading transistors are directly connected to the second terminals of the at least one photoresistor.

18. The OLED display substrate according to claim 1, wherein the second terminals of the at least one photoresistor are directly connected to the one or more first voltage terminals.

* * * * *